(12) United States Patent
Yeo et al.

(10) Patent No.: US 10,355,061 B2
(45) Date of Patent: Jul. 16, 2019

(54) ORGANIC LIGHT EMITTING DISPLAY DEVICE

(71) Applicant: LG Display Co., Ltd., Seoul (KR)

(72) Inventors: Jong-Hoon Yeo, Incheon (KR); Seung-Han Paek, Bucheon-si (KR); Hyo-Dae Bae, Paju-si (KR); Young-Mu Oh, Seoul (KR); Jeong-Won Lee, Goyang-si (KR); Heon-Il Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 195 days.

(21) Appl. No.: 15/197,538

(22) Filed: Jun. 29, 2016

(65) Prior Publication Data

US 2017/0005150 A1    Jan. 5, 2017

(30) Foreign Application Priority Data

Jun. 30, 2015  (KR) .................... 10-2015-0093272

(51) Int. Cl.
*H01L 27/32* (2006.01)
*H01L 51/52* (2006.01)
*H01L 51/56* (2006.01)
*H01L 27/12* (2006.01)

(52) U.S. Cl.
CPC ...... *H01L 27/3246* (2013.01); *H01L 27/3262* (2013.01); *H01L 27/3276* (2013.01); *H01L 27/3279* (2013.01); *H01L 51/5228* (2013.01); *H01L 51/5237* (2013.01); *H01L 51/56* (2013.01); *H01L 27/124* (2013.01); *H01L 27/1259* (2013.01); *H01L 2227/323* (2013.01); *H01L 2251/558* (2013.01)

(58) Field of Classification Search
None
See application file for complete search history.

(56) References Cited

U.S. PATENT DOCUMENTS 7,291,973 B2 * 11/2007 Ishihara .............. H01L 51/5262
313/505
7,427,783 B2 *  9/2008 Lee ..................... H01L 51/5228
257/40

(Continued)

FOREIGN PATENT DOCUMENTS

CN          104124259 A    10/2014
WO    WO 2014/104703 A1    7/2014

OTHER PUBLICATIONS

"Google.com Definition of Bent", downloaded Aug. 3, 2018.*

(Continued)

*Primary Examiner* — Michael Lebentritt
(74) *Attorney, Agent, or Firm* — Fenwick & West LLP

(57) ABSTRACT

An organic light emitting display device includes a substrate including a pixel region and a non-pixel region; a first electrode over the substrate in the pixel region; an organic emitting layer over the first electrode in the pixel region; a bank over the substrate in the non-pixel region; an auxiliary conductive line covered by the bank in the non-pixel region, a thickness of the auxiliary line larger than a thickness of the first electrode; and a second electrode on the organic emitting layer in the pixel region and on the bank in the non-pixel region, the second electrode electrically connected to the auxiliary conductive line.

21 Claims, 12 Drawing Sheets

(56) References Cited

U.S. PATENT DOCUMENTS

| | | | | |
|---|---|---|---|---|
| 7,679,284 B2* | 3/2010 | Kubota | | H01L 51/5228 |
| | | | | 313/498 |
| 7,839,083 B2* | 11/2010 | Kubota | | H01L 27/3258 |
| | | | | 313/505 |
| 7,982,392 B2* | 7/2011 | Ito | | H01L 51/5284 |
| | | | | 313/504 |
| 8,158,466 B2* | 4/2012 | Kim | | H01L 27/1214 |
| | | | | 257/E27.111 |
| 8,299,702 B2* | 10/2012 | Choi | | H01L 27/3276 |
| | | | | 313/498 |
| 8,686,420 B2* | 4/2014 | Oh | | B82Y 10/00 |
| | | | | 257/59 |
| 8,742,404 B2* | 6/2014 | Choi | | H01L 51/5215 |
| | | | | 257/40 |
| 8,766,288 B2* | 7/2014 | Chen | | H01L 27/3279 |
| | | | | 257/88 |
| 8,907,332 B2* | 12/2014 | Ye | | H01L 51/5044 |
| | | | | 257/40 |
| 9,018,621 B2* | 4/2015 | Park | | H01L 51/525 |
| | | | | 257/40 |
| 9,202,848 B2* | 12/2015 | Kim | | H01L 27/3211 |
| 9,276,230 B2* | 3/2016 | Kim | | H01L 51/5203 |
| 9,312,279 B2* | 4/2016 | Cha | | H01L 27/1225 |
| 9,368,745 B2* | 6/2016 | Lee | | H01L 51/52 |
| 9,384,687 B2* | 7/2016 | Lee | | G09G 3/20 |
| 9,466,648 B2* | 10/2016 | Kim | | H01L 27/3246 |
| 9,515,127 B2* | 12/2016 | Pyo | | H01L 27/3211 |
| 9,536,933 B2* | 1/2017 | Sato | | H01L 51/5088 |
| 9,577,207 B2* | 2/2017 | Kim | | H01L 51/5203 |
| 9,601,558 B2* | 3/2017 | Li | | H01L 51/5228 |
| 9,614,016 B2* | 4/2017 | Choi | | H01L 27/3258 |
| 10,026,790 B2* | 7/2018 | Kim | | H01L 27/3246 |
| 2005/0253508 A1* | 11/2005 | Okano | | H01L 27/3246 |
| | | | | 313/506 |
| 2009/0215350 A1* | 8/2009 | Takei | | H01L 27/3246 |
| | | | | 445/23 |
| 2010/0309101 A1* | 12/2010 | Kanegae | | H01L 27/3246 |
| | | | | 345/76 |
| 2017/0062529 A1* | 3/2017 | Paek | | H01L 27/322 |

OTHER PUBLICATIONS

European Patent Office, Extended European Search Report and Opinion, EP Patent Application No. 16177110.0, dated Oct. 28, 2016, eight pages.

That State Intellectual Property Office of the People's Republic of China, First Office Action, CN Patent Application No. 201610498915.9, dated Oct. 8, 2018, 24 pages.

* cited by examiner

ORGANIC LIGHT EMITTING DISPLAY DEVICE

CROSS-REFERENCE TO RELATED APPLICATION

This application claims the benefit of Korean Patent Application No. 10-2015-0093272, filed in Republic of Korea on Jun. 30, 2015, which is hereby incorporated by reference.

BACKGROUND

1. Field of the Invention

Embodiments of the invention relate to an organic light emitting display (OLED) device, and more particularly, to an OLED being capable of preventing a brightness non-uniformity problem.

2. Discussion of the Related Art

Recently, flat panel display devices, such as a plasma display panel (PDP), a liquid crystal display (LCD) device, and an OLED device, are widely researched and used.

Among these flat panel display devices, since the OLED device as a self-emission type display device does not implement a backlight unit, the OLED device may have advantages of light weight and thin profile.

In addition, the OLED device has excellent characteristics of a viewing angle, a contrast ratio, power consumption, a response time, production costs, production yield, and so on.

The OLED device may include a switching thin film transistor (TFT), which is connected to gate and data lines, a driving TFT, which is connected to the switching TFT, and an organic emitting diode. The organic emitting diode is connected to the driving TFT and includes a first electrode, an organic emitting layer and a second electrode.

The first electrode may serve as an anode and may include a transparent conductive material having a relatively high work function. The second electrode may serve as a cathode and may include a metallic material having a relatively low work function. The metallic material may have an opaque property.

In a top emission type OLED device, the light from the organic emitting layer passes through the second electrode being opaque. Accordingly, a thickness of the second electrode should be controlled to have a light-transmissive property.

However, when the thickness of the second electrode is lowered, the resistance of the second electrode is increased such that a voltage drop in the second electrode becomes significant, and causes non-uniformity in brightness.

Particularly, the above brightness non-uniformity problem is serious in a large-size OLED device.

To prevent the above brightness non-uniformity problem, an auxiliary line, which is connected to the second electrode, may be formed to reduce the resistance of the second electrode.

FIG. 1 is a schematic cross-sectional view of the related art OLED device including an auxiliary line.

Referring to FIG. 1, in the related art OLED device 10, a semiconductor layer 13 including a first region 13a and second region 13b at both sides of the first region 13a is formed on a substrate 11. The first region 13a is formed of intrinsic poly-silicon, and the second region 13b is formed of impurity-doped poly-silicon.

A gate insulating layer 15 is formed on the semiconductor layer 13, and a gate electrode 25 corresponding to the first region 13a of the semiconductor layer 13 is formed on the gate insulating layer 15. An interlayer insulating layer 17 is formed on the gate electrode 25.

In this instance, semiconductor contact holes 21 are formed through the gate insulating layer 15 and the interlayer insulating layer 17 to expose the second regions 13b of the semiconductor layer 13.

A source electrode 33 and a drain electrode 36, which are spaced apart from each other, are formed on the interlayer insulating layer 17. The source and drain electrodes 33 and 36 are electrically connected to the second regions 13b of the semiconductor layer 13 through the semiconductor contact holes 21, respectively.

The semiconductor layer 13, the gate electrode 25, the source electrode 33 and the drain electrode 36 constitute a driving TFT DTr.

A first passivation layer 19, which may include a flat top surface, is formed on or over the driving TFT DTr, and an auxiliary line 50 is formed on the first passivation layer 19 at a boundary of a pixel region P.

A second passivation layer 41, which may include a flat top surface, is formed on the auxiliary line 50.

In this instance, a drain contact hole 43, which exposes the drain electrode 36 of the driving TFT DTr, is formed through the first and second passivation layers 19 and 41, and a first auxiliary contact hole 53, which exposes the auxiliary line 50, is formed through the second passivation layer 41.

A first electrode 70, which is electrically connected to the drain electrode 36 through the drain contact hole 43, is formed on the second passivation layer 41 in the pixel region P. In addition, an auxiliary electrode 71, which is electrically connected to the auxiliary line 50 through the first auxiliary contact hole 53, is formed on the second passivation layer 41 at a boundary of the pixel region P.

A bank 73 is formed at a boundary of the pixel region P. The bank 73 covers edges of the first electrode 70 and the auxiliary electrode 71.

In this instance, the bank 73 has a lattice shape to surround the pixel region P and includes a second auxiliary contact hole 77 exposing the auxiliary electrode 71.

An organic emitting layer 75 is formed on the first electrode 70 in the pixel region P, and a second electrode 80 is formed over an entire surface of the substrate 11 including the bank 73 and the organic emitting layer 75. As a result, the second electrode 80 is electrically connected to auxiliary electrode 71 through the second auxiliary contact hole 77.

The first and second electrodes 70 and 80 and the organic emitting layer 75 therebetween constitute an organic emitting diode E.

Since the auxiliary line 50 is electrically connected to the second electrode 80 through the auxiliary electrode 71, the resistance of the second electrode 80 is lowered. As a result, the brightness non-uniformity problem can be prevented or minimized.

However, fabricating the OLED device 10 including the auxiliary line 50, the second passivation layer 41 and the first auxiliary contact hole 53, involves complicated process and increases the production cost of the OLED device 10.

In addition, in order to sufficiently reduce the resistance of the second electrode 80, a width and/or a thickness of the auxiliary line 50 and the auxiliary electrode 71 should be increased. However, since the auxiliary electrode 71 is positioned at the boundary of the pixel region P to be spaced part from the first electrode 70 and the boundary of the pixel region P has a narrow width for the aperture ratio, there is limit to how much the width of the auxiliary electrode 71 can be increased.

In addition, an overlapping area between the auxiliary line 50 and the first electrode 70 should be minimized to reduce a parasitic capacitance between the auxiliary line 50 and the first electrode 70, hence increasing the width of the auxiliary line 50 is limited.

Moreover, there is limit to increasing the thickness of the auxiliary line 50 and the auxiliary electrode 71, because a thin profile OLED device 10 is desirable.

SUMMARY

Embodiments relate to an organic light emitting display device including a transparent electrode with low resistivity.

In one or more embodiments, an organic light emitting display device comprises: a substrate including a pixel region and a non-pixel region; a first electrode over the substrate in the pixel region; an organic emitting layer over the first electrode in the pixel region; a bank over the substrate in the non-pixel region; an auxiliary conductive line covered by the bank in the non-pixel region, a thickness of the auxiliary line larger than a thickness of the first electrode; and a second electrode on the organic emitting layer in the pixel region and on the bank in the non-pixel region, the second electrode electrically connected to the auxiliary conductive line.

In one or more embodiments, the bank surrounds the organic emitting layer to define the pixel region.

In one or more embodiments, the bank includes a hydrophobic property material.

In one or more embodiments, the bank includes a contact hole, the second electrode electrically connected to the auxiliary conductive line though the contact hole to reduce a resistance of the second electrode.

In one or more embodiments, an auxiliary electrode in the non-pixel region, the auxiliary electrode in a same layer as the first electrode but separated from the first electrode by the bank, the auxiliary electrode electrically coupled to the auxiliary conductive line.

In one or more embodiments, the organic light emitting display further comprises: a thin film transistor over the substrate; and a passivation layer over the thin film transistor. The auxiliary conductive line and the first electrode may be both formed above the passivation layer.

In one or more embodiments, a side surface of the bank has a stair shape where the side surface of the bank adjoins the first electrode between the pixel region and the non-pixel region.

In one or more embodiments, the bank covers a top surface and side surfaces of the auxiliary conductive line.

In one or more embodiments, the auxiliary conductive line has the thickness greater than a sum of thicknesses of the first electrode, the organic emitting layer and the second electrode.

In one or more embodiments, the auxiliary conductive line faces the substrate in a direction, a portion of the bank on the auxiliary conductive line has a thickness in the direction smaller than the thickness of the auxiliary conductive line in the direction.

In one or more embodiments, the auxiliary conductive line has a sheet resistance smaller than a sheet resistance of the second electrode.

In one or more embodiments, the second electrode has a thickness such that a light transmittance of the second electrode is 10% or more or a sheet resistance of the second electrode is 100 Ω/sq or less.

In one or more embodiments, the bank covers side surfaces of the auxiliary conductive line and has a height being same as the auxiliary conductive line such that the second electrode contacts an entire top surface of the auxiliary conductive line.

Embodiments relate to a method of manufacturing an organic light emitting display device. In one or more embodiments, the method comprises: forming a substrate including a pixel region and a non-pixel region; forming a first electrode over the substrate in the pixel region; forming an auxiliary conductive line over the substrate in the non-pixel region, a thickness of the auxiliary conductive line greater than a thickness of the first electrode; forming a bank to cover the auxiliary conductive line; forming an organic emitting layer over the first electrode in the pixel region through an opening of the bank in the pixel region; and forming a second electrode on the organic emitting layer in the pixel region and on the bank in the non-pixel region, the second electrode connected to the auxiliary conductive line.

In one or more embodiments, the organic emitting layer is formed by a soluble process.

In one or more embodiments, the method further comprises forming a contact hole in the bank prior to forming the second electrode, wherein the second electrode is formed on the bank in the non-pixel region and is electrically connected to the auxiliary conductive line through the contact hole to reduce a resistance of the second electrode.

In one or more embodiments, the method further comprises forming an auxiliary electrode in the non-pixel region, the auxiliary electrode in a same layer as the first electrode, the auxiliary electrode in the non-pixel region and the first electrode simultaneously formed together. The auxiliary conductive line may be electrically coupled to the auxiliary electrode.

In one or more embodiments, the bank including a hydrophobic property material is formed by a soluble process to fill a space between the auxiliary electrode and the first electrode to separate the auxiliary electrode and the first electrode.

In one or more embodiments, a side surface of the bank has a stair shape where the side surface of the bank adjoins the first electrode between the pixel region and the non-pixel region.

In one or more embodiments, the method further comprises: forming a thin film transistor over the substrate prior to forming the first electrode and the auxiliary conductive line; and forming a passivation layer over the thin film transistor prior to forming the first electrode and the auxiliary conductive line. The auxiliary conductive line and the first electrode may be both formed above the passivation layer.

In one or more embodiments, the bank covers a top surface and side surfaces of the auxiliary conductive line.

In one or more embodiments, the bank covers side surfaces of the auxiliary conductive line and has a height being same as the auxiliary conductive line such that the second electrode contacts an entire top surface of the auxiliary conductive line.

It is to be understood that both the foregoing general description and the following detailed description are by example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to embodiments of the invention, examples of which are illustrated in the accompanying drawings.

Figure 2:
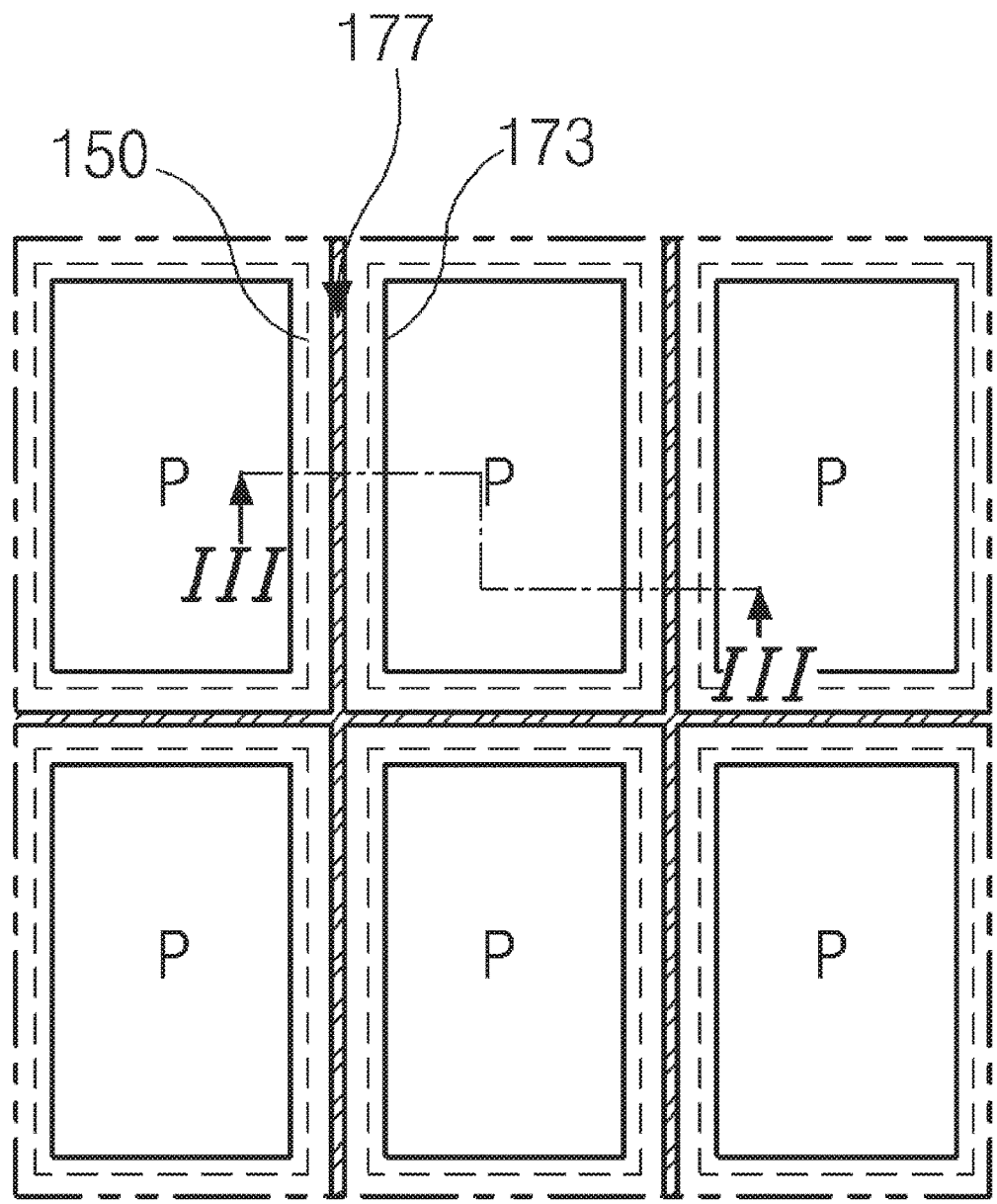
FIG. 2 is a schematic plane view of an OLED device according to a first embodiment of the present invention.

FIG. 2 is a schematic plane view of an OLED device according to a first embodiment of the present invention.

Referring to FIG. 2, an OLED device 100 according to the first embodiment of the present invention includes a bank 173 having a lattice shape to surround a pixel region P and an auxiliary line 150 (herein also referred to as "an auxiliary conductive line") under the bank 173.

The bank 173 includes an auxiliary contact hole 177 exposing the auxiliary line 150. The auxiliary line 150 and the auxiliary contact hole 177 have a lattice shape to surround the pixel region P.

Although not shown in FIG. 2, a first electrode 170 (of FIG. 3) of an organic emitting diode E is disposed in each pixel region P, and a second electrode 180 (of FIG. 3) of the organic emitting diode E is disposed on an entire surface of a substrate 101 (of FIG. 3) and on an upper side of the bank 173. As a result, the second electrode 180 is electrically connected to the auxiliary line 150 through the auxiliary contact hole 177 of the bank 173.

Figure 3:
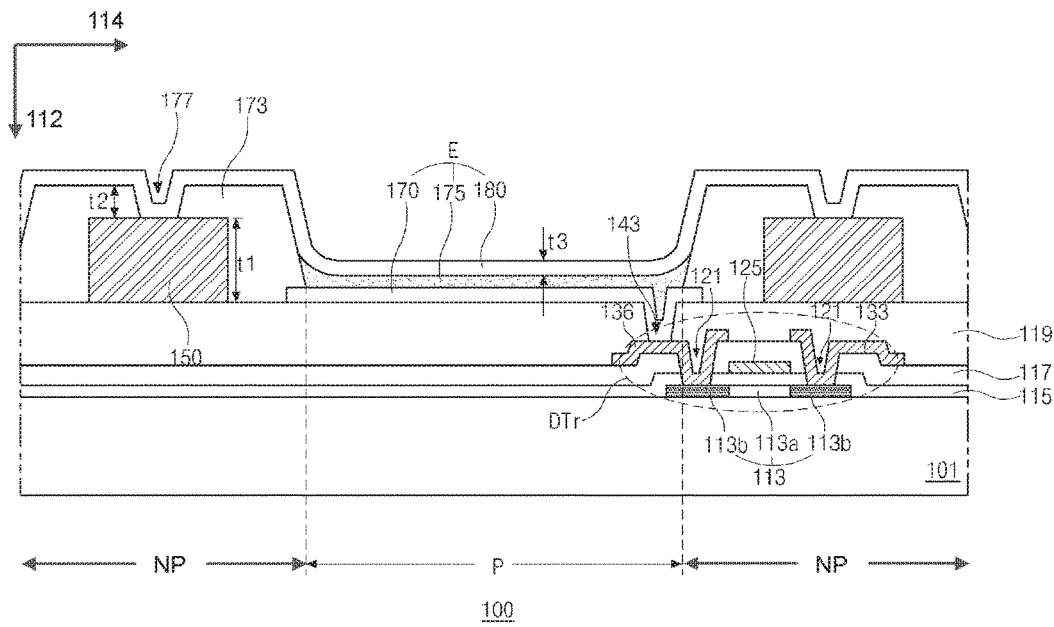
FIG. 3 is a schematic cross-sectional view taken along the line III-III in FIG. 2.

FIG. 3 is a schematic cross-sectional view taken along the line III-III in FIG. 2.

Referring to FIG. 3, the OLED device 100 includes the substrate 101 having the pixel region P and non-pixel region NP, the first and second electrodes 170 and 180, an organic emitting layer 175 (also referred to as "an organic light emitting layer 175") between the first and second electrodes 170 and 180, the bank 173 in a non-pixel region NP and the auxiliary line 150 in the non-pixel region NP and being spaced apart from the first electrode 170.

In this instance, the first and second electrodes 170 and 180 and the organic emitting layer 175 therebetween constitute the organic emitting diode E in a pixel region P.

The first electrode 170 is positioned in the pixel region P and includes a conductive material having a relatively high work function to serve as an anode. For example, the first electrode 170 may include a transparent conductive material, e.g., indium-tin-oxide (ITO) and indium-zinc-oxide (IZO).

The auxiliary line 150 is formed of a different material than a material of the first electrode 170 and has a resistance smaller than a resistance of the second electrode 180. If the auxiliary line 150 and the first electrode are formed of same material, there is limitation of increasing a width of the auxiliary line 150. For example, the auxiliary line 150 may include a low resistance metallic material, e.g., copper (Cu), molybdenum (Mo) and aluminum (Al), and may have single or multi-layered structure. The auxiliary line 150 faces the substrate 101 in a vertical direction 112 and has a first thickness t1 between a bottom surface of the auxiliary line 150 and a top surface of the auxiliary line 150 in the vertical direction 112.

The bank 173 covers the auxiliary line 150 and edges of the first electrode 170. The bank 173 may include an organic material or an inorganic material. In one embodiment, a portion of the bank 173 on the auxiliary line 150 has a second thickness t2 between the top surface of the bank 173 and a top surface of the auxiliary line 150, where second thickness t2 is smaller than the first thickness t1. When the organic material is formed by a soluble process, the bank 173 may have a hydrophobic property. In one or more embodiments, the bank 173 covers a top surface and side surfaces of the auxiliary line 150 in the non-pixel region NP as shown in FIG. 3.

The organic emitting layer 175 is disposed on a portion (e.g., center) of the first electrode 170 exposed through an opening of the bank 173. The organic emitting layer 175 may include a red emitting pattern, a green emitting pattern, a blue emitting pattern, or a white emitting pattern, or some other color light emitting pattern. The organic emitting layer 175 may be formed by a deposition process or a soluble process, e.g., an inkjet printing and a nozzle printing.

The bank 173 includes the auxiliary contact hole 177 exposing the auxiliary line 150, and the second electrode 180 is disposed on the bank 173 and the organic emitting layer 175. As a result, the second electrode 180 is electrically connected to the auxiliary line 150 through the auxiliary contact hole 177.

The second electrode 180 may include a metallic material having a relatively low work function to serve as a cathode. For example, the metallic material for the second electrode 180 may be silver, magnesium or their alloy.

In other embodiments, the first electrode 170 may be a cathode and the second electrode 180 may be an anode.

Since the above metallic material generally has an opaque property, a third thickness t3 of the second electrode 180 should be controlled or adjusted to be semi-transparent. For example, the third thickness t3 of the second electrode 180 between a top surface of the second electrode 180 and a bottom surface of the second electrode 180 in the pixel region P may be controlled such that the transmittance of the second electrode 180 is about 10% or more or the sheet resistance or the resistance of the second electrode 180 is about 100 Ω/sq or less. The third thickness t3 of the second electrode 180 is varied according to the metallic material.

In the present invention, the sheet resistance of the second electrode 180 is reduced because of the auxiliary line 150.

The auxiliary line 150 is positioned inside the bank 173, and the auxiliary line 150 and the first electrode 170 are formed of different material. The bank 173 has sufficient thickness to define the pixel region P. Accordingly, sufficient space for increasing the first thickness t1 of the auxiliary line 150 is provided such that the voltage drop in the second electrode 180 can be reduced. In addition, even if the first thickness t1 of the auxiliary line 150 is increased, a thickness of the OLED device 100 does not need to be increased.

In one example, the first thickness t1 of the auxiliary line 150 is greater than the first electrode 170. For example, the first thickness t1 may be about 5000 Å or more such that the second electrode 180 has the sheet resistance of about 1.0 Ω/sq or less.

In one example, the second thickness t2 of the bank 173 on the auxiliary line 150 may be 3 μm or less. The second thickness t2 may be between 1 μm and 2 μm.

In this instance, despite the third thickness t3 of the second electrode 180 being reduced to have the semi-transparent property or transmissive property, the sheet resistance of the second electrode 180 is sufficiently lowered thanks to the auxiliary line 150. Accordingly, the voltage drop problem in the second electrode 180 and the non-uniform brightness problem in the OLED device 100 may be prevented.

The first thickness t1 of the auxiliary line 150 may be greater than a total thickness of the organic emitting diode E, i.e., a thickness summation of the first electrode 170, the organic emitting layer 175 and the second electrode 180.

A driving TFT DTr, which is positioned between the substrate 101 and the first electrode 170 and is connected to the first electrode 170, is formed on the substrate 101.

For example, a semiconductor layer 113 including a first region 113a and second regions 113b at both sides of the first region 113a is formed on a substrate 101. The first region 113a is formed of intrinsic poly-silicon, and the second region 113b is formed of impurity-doped poly-silicon.

A gate insulating layer 115 is formed on the semiconductor layer 113, and a gate electrode 125 corresponding to the first region 113a of the semiconductor layer 113 is formed on the gate insulating layer 115. An interlayer insulating layer 117 is formed on the gate electrode 125.

In this instance, semiconductor contact holes 121 are formed through the gate insulating layer 115 and the interlayer insulating layer 117 to expose the second regions 113b of the semiconductor layer 113.

A source electrode 133 and a drain electrode 136, which are spaced apart from each other, are formed on the interlayer insulating layer 117. The source and drain electrodes 133 and 136 are electrically connected to the second regions 113b of the semiconductor layer 113 through the semiconductor contact holes 121, respectively.

The semiconductor layer 113, the gate electrode 125, the source electrode 133 and the drain electrode 136 constitute a driving TFT DTr.

A passivation layer 119, which may include a flat top surface, is formed on or over the driving TFT DTr. In this instance, a drain contact hole 143, which exposes the drain electrode 136 of the driving TFT DTr, is formed through the passivation layer 119.

The first electrode 170 is disposed on the passivation layer 119 and in the pixel region P. The first electrode 170 is electrically connected to the drain electrode 136 through the drain contact hole 143.

The auxiliary line 150 is disposed on the passivation layer 119 and is positioned in the non-pixel region NP to be spaced apart from the first electrode 170.

FIGS. 4A through 4F are schematic cross-sectional views illustrating a fabricating process of an OLED device according to the first embodiment of the present invention.

Since a fabricating process of the driving TFT in the present invention is similar to the general fabricating process, the description thereof is omitted.

Figure 4A:
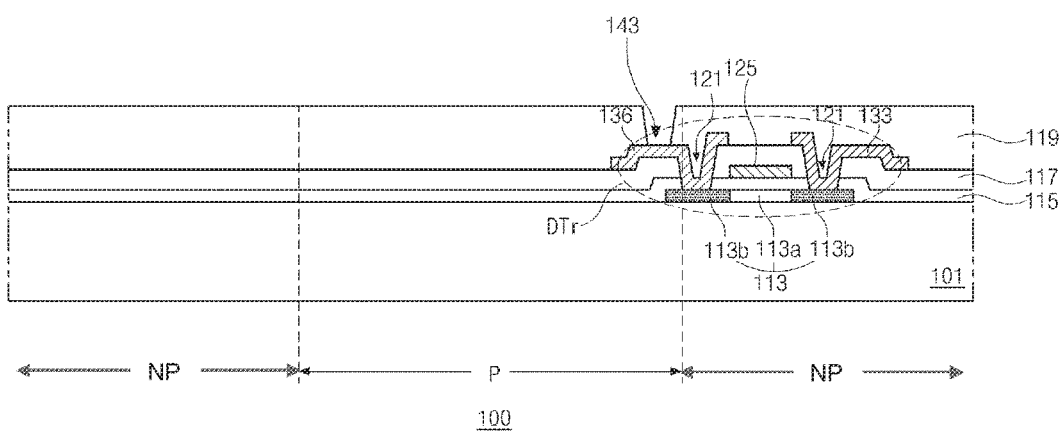
FIGS. 4A through 4F are schematic cross-sectional views illustrating a fabricating process of an OLED device according to the first embodiment of the present invention.

As shown in FIG. 4A, an organic material, e.g., photo-acryl, is coated over the substrate 101, where the driving TFT DTr is formed, to form the passivation layer 119, and a mask process is performed to form the drain contact hole 143 in the passivation layer 119. The drain electrode 136 of the driving TFT DTr is exposed through the drain contact hole 143.

Figure 4B:
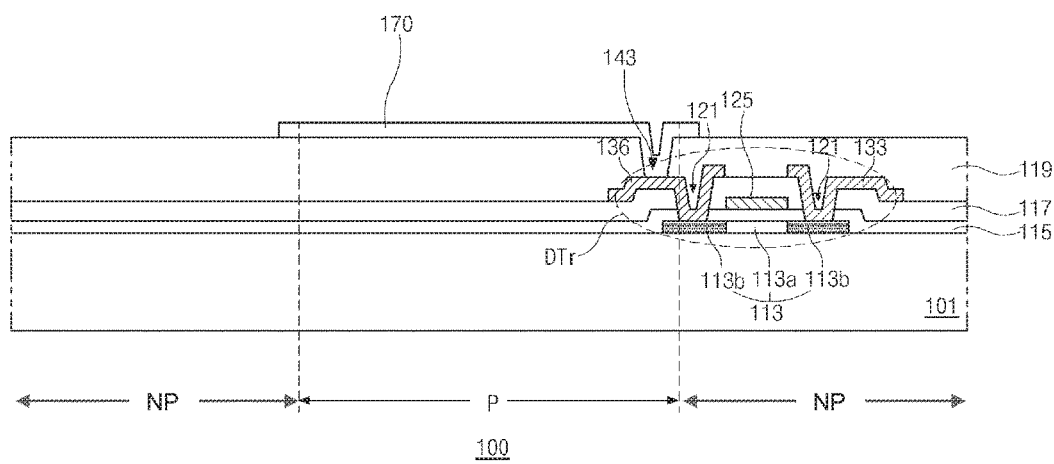

Next, as shown in FIG. 4B, the first electrode 170 is formed on the passivation layer 119 and in the pixel region P. The first electrode 170 is electrically connected to the drain electrode 136 through the drain contact hole 143. For example, the first electrode 170 may be formed of a transparent conductive material, e.g., ITO or IZO.

Figure 4C:
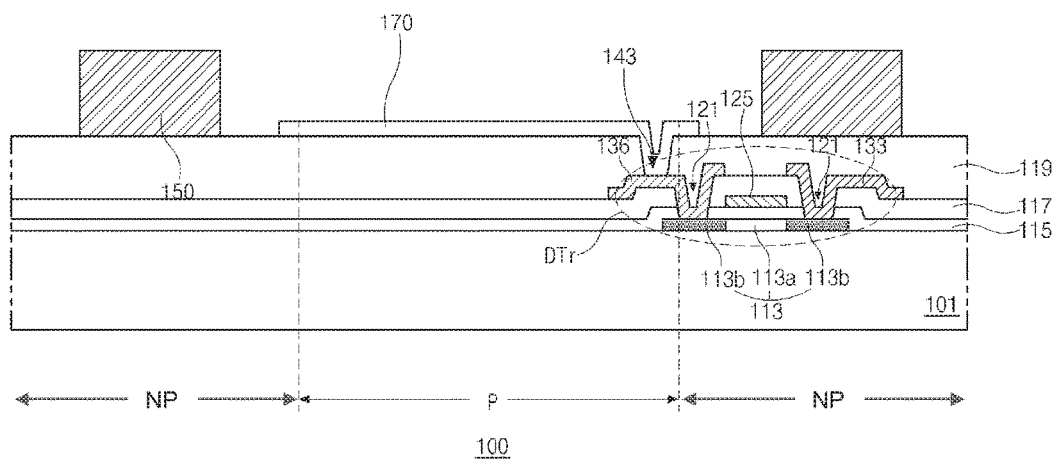

Next, as shown in FIG. 4C, the auxiliary line 150 is formed in the non-pixel region NP to be spaced apart from the first electrode 170. The auxiliary line 150 includes a low resistance metallic material. For example, the auxiliary line 150 may include at least one of Cu, Mo and Al and may have single or multi-layered structure.

Figure 4D:
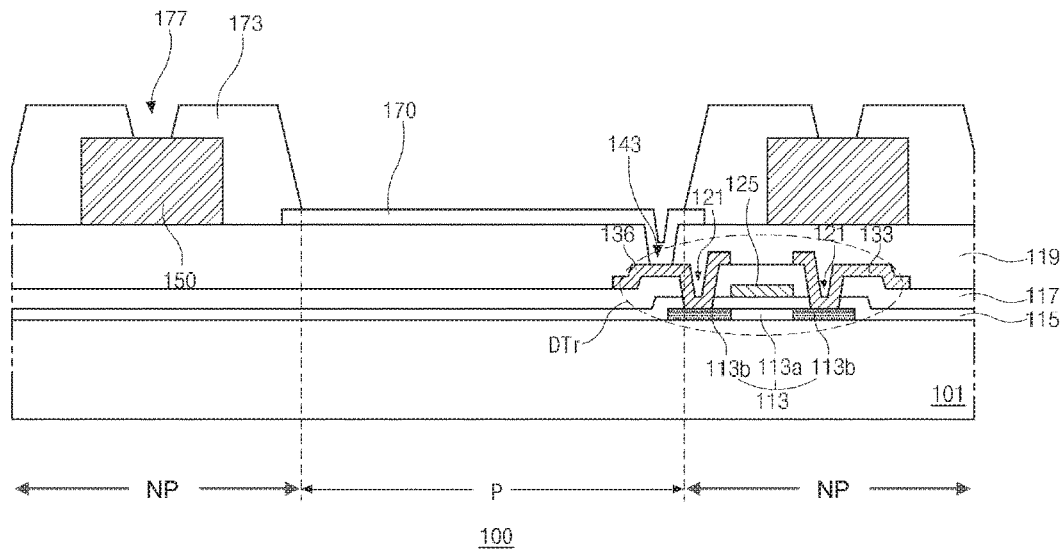

Next, as shown in FIG. 4D, the bank 173 covering the auxiliary line 150 and edges of the first electrode 170 is formed. A mask process is performed to form the auxiliary contact hole 177 exposing the auxiliary line 150. The bank 173 may include an organic material or an inorganic material. When the organic emitting layer 175 is formed by a soluble process, the bank 173 may have a hydrophobic property.

Figure 4E:
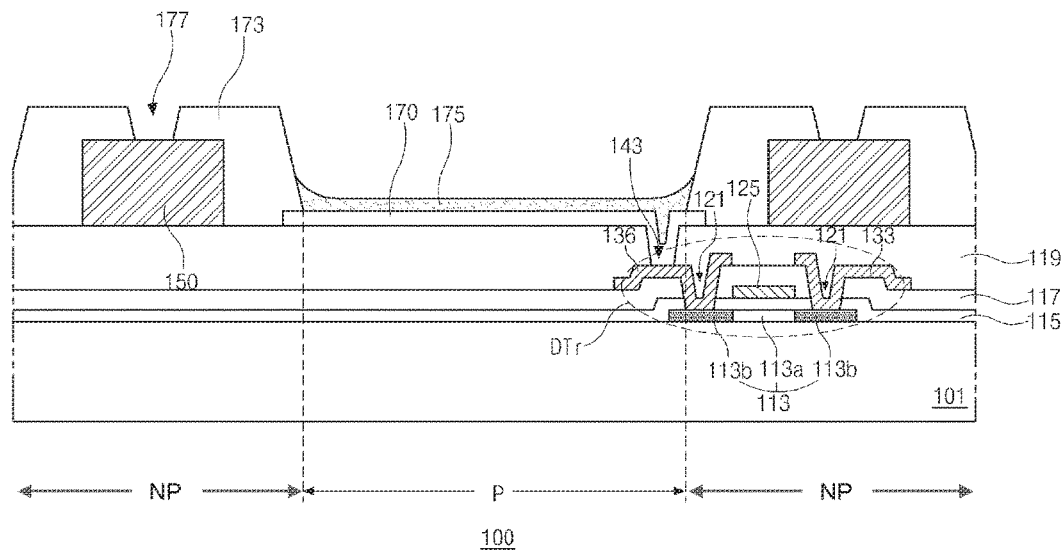

Next, as shown in FIG. 4E, the organic emitting layer 175 is formed on the first electrode 170 in the pixel region P. The organic emitting layer 175 may include a red emitting pattern, a green emitting pattern, a blue emitting pattern, and a white emitting pattern, or some other color light emitting pattern. The organic emitting layer 175 may be formed by a deposition process or a soluble process, e.g., an inkjet printing and a nozzle printing.

Figure 4F:
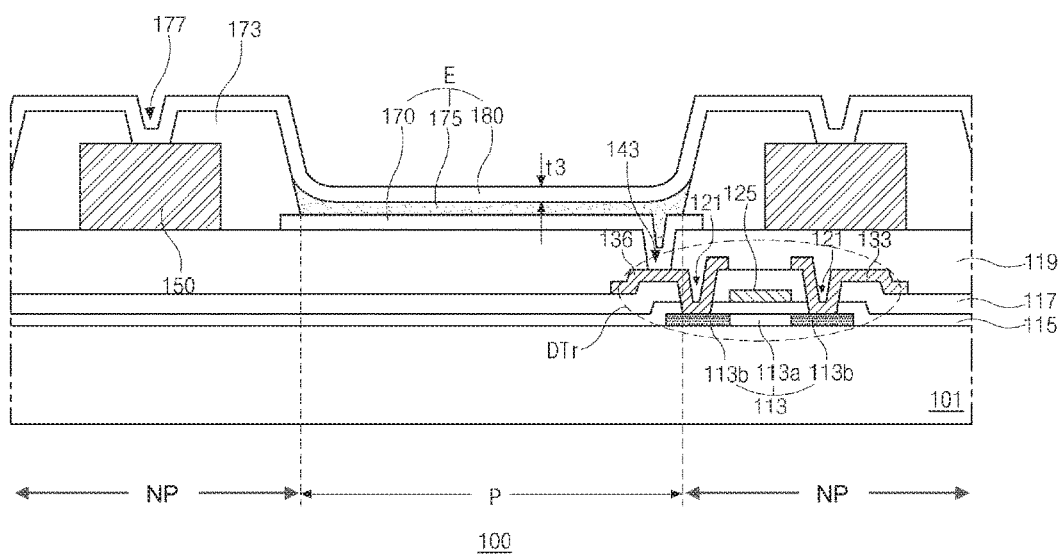

Next, as shown in FIG. 4F, the second electrode 180 is formed over an entire surface of the substrate 101. As a result, the second electrode 180 is formed on the bank 173 and the organic emitting layer 175 and is electrically connected to the auxiliary line 150 through the auxiliary contact hole 177.

The second electrode 180 may include a metallic material having a relatively low work function to serve as a cathode. For example, the metallic material for the second electrode 180 may be silver, magnesium or their alloy.

Figure 1:
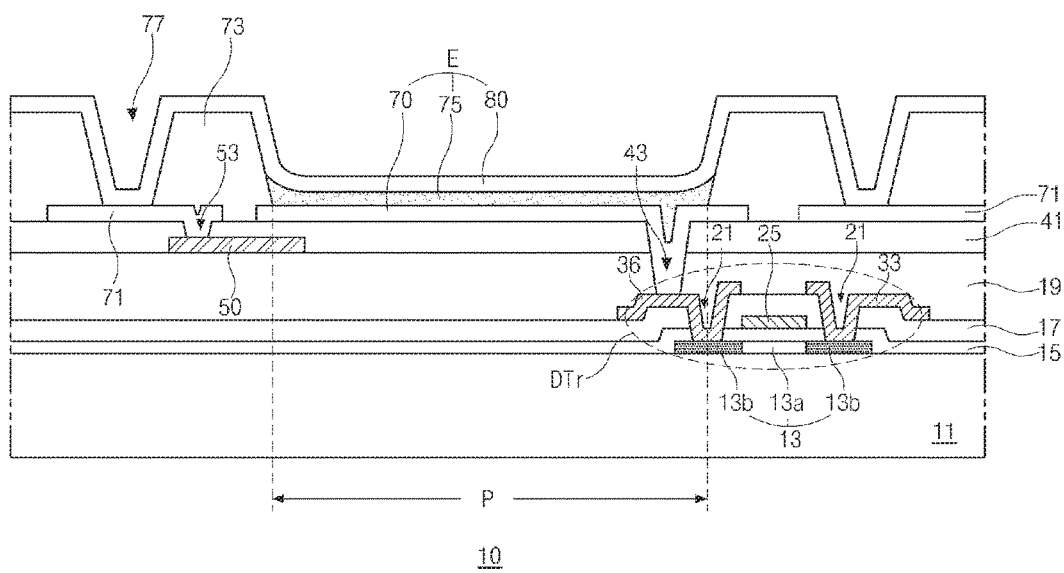
FIG. 1 is a schematic cross-sectional view of the related art OLED device including an auxiliary line.

In the OLED device 100 of the present invention, the voltage drop problem can be prevented without the second passivation layer 41 (of FIG. 1) and the first auxiliary contact hole 53 (of FIG. 1).

In addition, since the auxiliary line 150 having a relatively large thickness is positioned inside the bank 173, a total thickness of the OLED device 100 is not increased by the auxiliary line 150.

As a result, the fabricating process of the OLED device 100 is simplified, and the production cost of the OLED device 100 is reduced.

Figure 5:
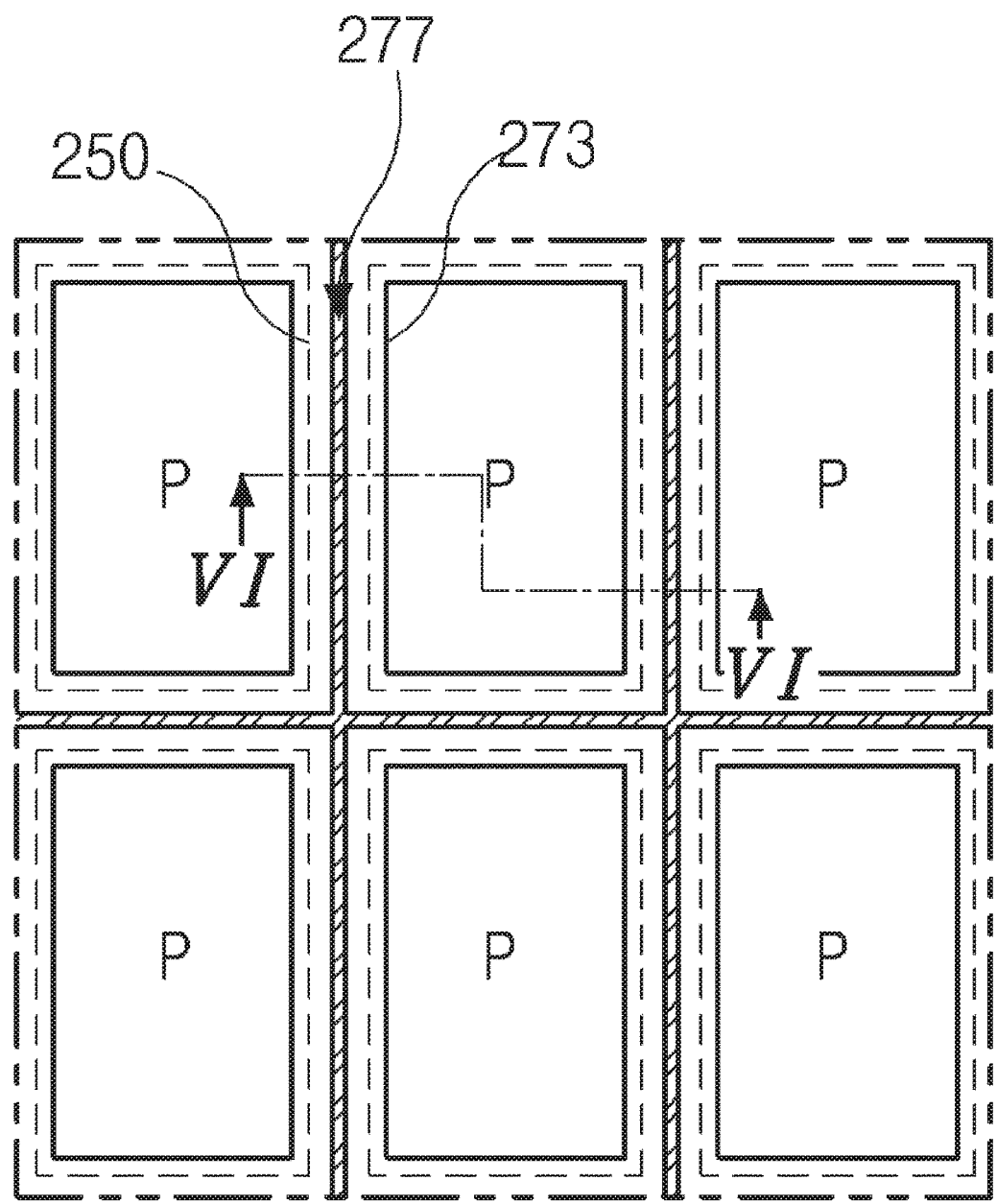
FIG. 5 is a schematic plane view of an OLED device according to a second embodiment of the present invention.

FIG. 5 is a schematic plane view of an OLED device according to a second embodiment of the present invention.

Referring to FIG. 5, an OLED device 200 according to the second embodiment of the present invention includes a bank 273 having a lattice shape to surround a pixel region P and an auxiliary line 250 under the bank 273.

The bank 273 includes an auxiliary contact hole 277 exposing the auxiliary line 250. The auxiliary line 250 and the auxiliary contact hole 277 have a lattice shape to surround the pixel region P.

Although not shown, a first electrode 270 (of FIG. 6) of an organic emitting diode E is disposed in each pixel region P, and an auxiliary electrode 271 (of FIG. 6) under the auxiliary line 250 is electrically connected to the auxiliary line 250. The second electrode 280 (of FIG. 6) of the organic emitting diode E is disposed on an entire surface of a substrate 201 (of FIG. 6) and on an upper side of the bank 273. As a result, the second electrode 280 is electrically connected to the auxiliary electrode 271 and the auxiliary line 250 through the auxiliary contact hole 277 of the bank 273.

Figure 6:
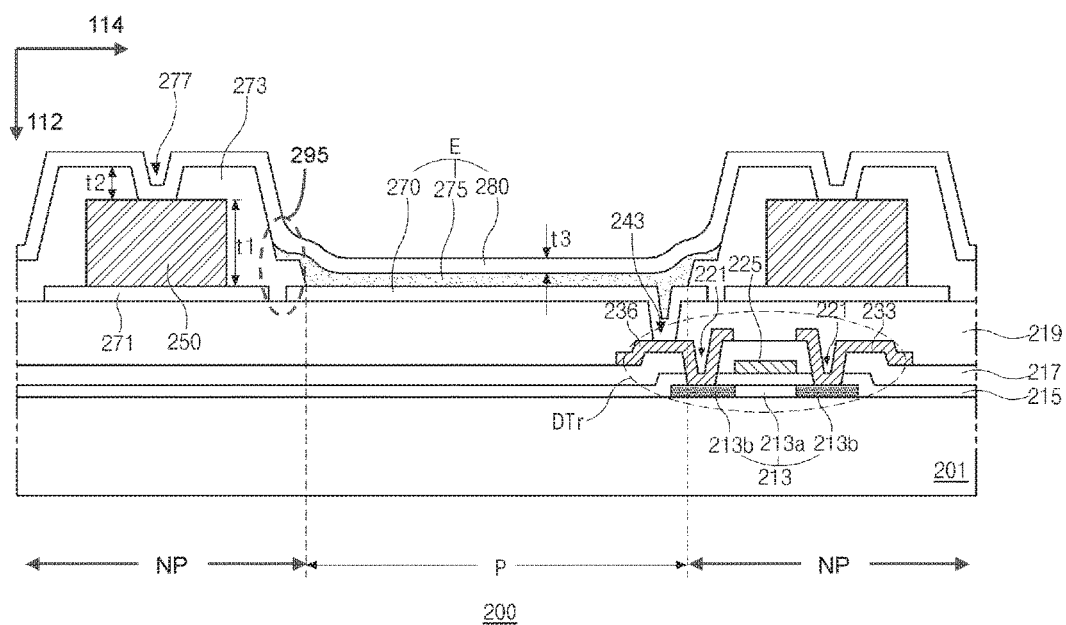
FIG. 6 is a schematic cross-sectional view taken along the line VI-VI in FIG. 5.

FIG. 6 is a schematic cross-sectional view taken along the line VI-VI in FIG. 5.

Referring to FIG. 6, the OLED device 200 includes the substrate 201 having the pixel region P and the non-pixel region NP, the first and second electrodes 270 and 280, an organic emitting layer 275 (also referred to as "an organic light emitting layer 275") between the first and second electrodes 270 and 280, the bank 273 in the non-pixel region NP, the auxiliary electrode 271, which is spaced apart from the first electrode 270, and the auxiliary line 250 on the auxiliary electrode 271.

In this instance, the first and second electrodes 270 and 280 and the organic emitting layer 275 therebetween constitute the organic emitting diode E.

The first electrode 270 is positioned in the pixel region P and includes a conductive material having a relatively high work function to serve as an anode. For example, the first electrode 270 may include a transparent conductive material, e.g., indium-tin-oxide (ITO) and indium-zinc-oxide (IZO).

The auxiliary electrode 271 is disposed in the non-pixel region NP. The auxiliary electrode 271 is formed of the same material and disposed on the same layer as the first electrode 270.

The auxiliary line 250 is formed of a different material than a material of the first electrode 270 and has a resistance smaller than a resistance of the second electrode 280. For example, the auxiliary line 250 may include a low resistance metallic material, e.g., copper (Cu), molybdenum (Mo) and aluminum (Al), and may have single or multi-layered structure. The auxiliary line 250 has a first thickness t1.

In FIG. 6, the auxiliary line 250 has a width in a horizontal direction 114 smaller than a width of the auxiliary electrode 271 in the horizontal direction 114 such that opposite edges of the auxiliary electrode 271 are exposed. Alternatively, the auxiliary line 250 may have the same width as the auxiliary electrode 271.

The bank 273 covers the auxiliary line 250, the edges of the auxiliary electrode 271 and an edge of the first electrode 270.

When the auxiliary line 250 has the width smaller than a width of the auxiliary electrode 271 to expose the edges of the auxiliary electrode 271, a side surface of the bank 273 has a stair shape 295. Namely, the bank 273 has a protruding portion at a lower part to form the stair shape.

In this instance, a bent portion of the stair shape 295 is positioned between the auxiliary electrode 271 and the first electrode 270. When the bent portion of the stair shape 295 is positioned on the auxiliary electrode 271, an amount of an organic material on the protruding portion of the bank 273 is increased. On the other hand, when the bent portion of the stair shape 295 is positioned on the first electrode 270, the protruding portion becomes too short such that a pile-up problem, i.e., a coffee ring effect problem, is insufficiently prevented. Specifically, a thickness of an edge portion of the organic emitting layer 275 in contact with the bank 273 can be greater than a thickness of a center portion of the organic emitting layer 275 in the drying process due to surface tension, if the bent portion of the stair shape 295 is positioned on the first electrode 270. Such pile-up problem can cause non-uniformity of brightness. Extending the stair shape 295 towards a center of the first electrode 270 may prevent the pile-up problem, but overextending the stair shape 295 towards the first electrode 270 decreases an emitting area.

The bank 273 may include an organic material or an inorganic material. A portion of the bank 273 on the auxiliary line 250 has a second thickness t2 being smaller than the first thickness t1. When the organic emitting layer 275 is formed by a soluble process, the bank 273 may have a hydrophobic property.

The organic emitting layer 275 is disposed on a center of the first electrode 270 exposed through an opening of the bank 273. The organic emitting layer 275 may include a red emitting pattern, a green emitting pattern, a blue emitting pattern, and a white emitting pattern. The organic emitting layer 275 may be formed by a deposition process or a soluble process, e.g., an inkjet printing and a nozzle printing.

Since the bank 273 has the stair shape 295 due to the auxiliary electrode 271 and the auxiliary line 250 and the bank 273 includes a hydrophobic property material, a pile-up problem generated during a drying process of the organic emitting layer 275, which is formed by a soluble process, is decreased. As a result, the thickness uniformity of the organic emitting layer 275 is improved.

The bank 273 includes the auxiliary contact hole 277 exposing the auxiliary line 250. The second electrode 280 is disposed on the bank 273 and the organic emitting layer 275. As a result, the second electrode 280 is electrically connected to the auxiliary line 250 through the auxiliary contact hole 277.

The second electrode 280 may include a metallic material having a relatively low work function to serve as a cathode. For example, the metallic material for the second electrode 280 may be silver, magnesium or their alloy.

Since the above metallic material generally has an opaque property, a third thickness t3 of the second electrode 280 should be controlled or adjusted to be semi-transparent. For example, the third thickness of the second electrode 280 may be controlled such that the transmittance of the second electrode 280 is about 10% or more or the sheet resistance or the resistance of the second electrode 280 is about 100 $\Omega$/sq or less. The third thickness t3 of the second electrode 280 is varied according to the metallic material.

On the other hand, since the second electrode 280 is formed to cover an entire surface of the substrate 201, there is a voltage drop problem.

In the present invention, the sheet resistance of the second electrode 280 is reduced because of the auxiliary line 250 and the auxiliary electrode 271.

The auxiliary line 250 and the auxiliary electrode are positioned inside the bank 273, and the auxiliary line 250 and the first electrode 270 are formed of different materials. The bank 273 has sufficient thickness to define the pixel region P. Accordingly, sufficient space for increasing the first thickness t1 of the auxiliary line 250 is provided such that the voltage drop in the second electrode 280 can be reduced. In addition, even if the first thickness t1 of the auxiliary line 250 is increased, a thickness of the OLED device 200 does not need to be increased.

The first thickness t1 of the auxiliary line 250 may be larger than the first electrode 270. In addition, the first thickness t1 of the auxiliary line 250 may be larger than the auxiliary electrode 271. For example, the first thickness t1 may be about 5000 Å or more such that the second electrode 280 has the sheet resistance of about 1.0 $\Omega$/sq or less.

In one example, the second thickness t2 of the bank 273 on the auxiliary line 250 may be 3 µm or less. The second thickness t2 may be between 1 µm and 2 µm.

In this instance, when the third thickness t3 of the second electrode 280 is reduced to have the semi-transparent property or transmissive property, the sheet resistance of the second electrode 280 is sufficiently lowered due to the auxiliary line 250 and the auxiliary electrode 271. Accordingly, the voltage drop problem in the second electrode 280 and the non-uniform brightness problem in the OLED device 200 may be prevented.

The first thickness t1 of the auxiliary line 250 may be larger than a total thickness of the organic emitting diode E, i.e., a thickness summation of the first electrode 270, the organic emitting layer 275 and the second electrode 280.

A driving TFT DTr, which is positioned between the substrate 201 and the first electrode 270 and is connected to the first electrode 270, is formed on the substrate 201.

For example, a semiconductor layer 213 including a first region 213a and second regions 213b at both sides of the first region 213a is formed on a substrate 201. The first region 213a is formed of intrinsic poly-silicon, and the second region 213b is formed of impurity-doped poly-silicon.

A gate insulating layer 215 is formed on the semiconductor layer 213, and a gate electrode 225 corresponding to the first region 213a of the semiconductor layer 213 is formed on the gate insulating layer 215. An interlayer insulating layer 217 is formed on the gate electrode 225.

In this instance, semiconductor contact holes 221 are formed through the gate insulating layer 215 and the interlayer insulating layer 217 to expose the second regions 213b of the semiconductor layer 213.

A source electrode 233 and a drain electrode 236, which are spaced apart from each other, are formed on the interlayer insulating layer 217. The source and drain electrodes 233 and 236 are electrically connected to the second regions 213b of the semiconductor layer 213 through the semiconductor contact holes 221, respectively.

The semiconductor layer 213, the gate electrode 225, the source electrode 233 and the drain electrode 236 constitute a driving TFT DTr.

A passivation layer 219, which may include a flat top surface, is formed on or over the driving TFT DTr. In this instance, a drain contact hole 243, which exposes the drain electrode 236 of the driving TFT DTr, is formed through the passivation layer 219.

The first electrode 270 is disposed on the passivation layer 219 and in the pixel region P. The first electrode 270 is electrically connected to the drain electrode 236 through the drain contact hole 243. In addition, the auxiliary electrode 271 is disposed on the passivation layer 219 and in the non-pixel region NP to be spaced apart from the first electrode 270. In other embodiments, the first electrode 270 is electrically connected to the source electrode 233, instead of the drain electrode 236, through the contact hole 243.

The auxiliary line 250 is disposed on the auxiliary electrode 271 and is also spaced part from the first electrode 270.

FIGS. 7A through 7F are schematic cross-sectional views illustrating a fabricating process of an OLED device according to the second embodiment of the present invention.

Figure 7A:
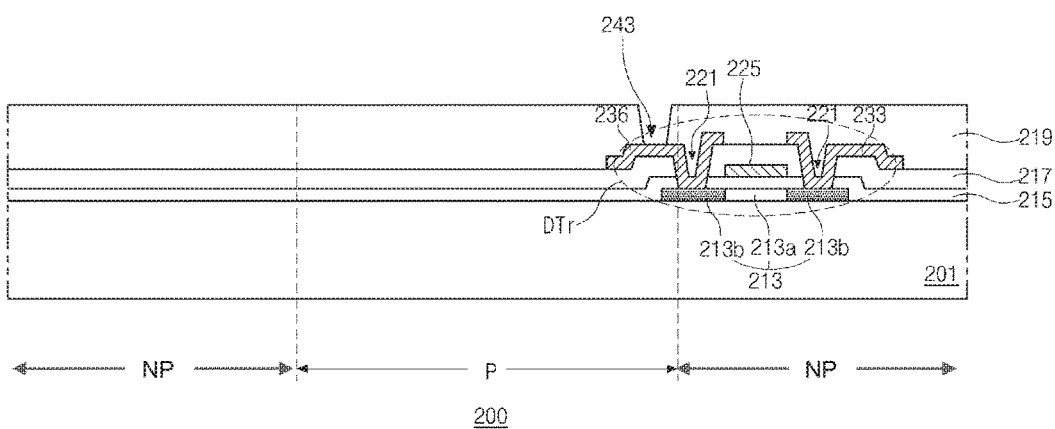
FIGS. 7A through 7F are schematic cross-sectional views illustrating a fabricating process of an OLED device according to the second embodiment of the present invention.

As shown in FIG. 7A, an organic material, e.g., photoacryl, is coated over the substrate 201, where the driving TFT DTr is formed, to form the passivation layer 219, and a mask process is performed to form the drain contact hole 243 in the passivation layer 219. The drain electrode 236 of the driving TFT DTr is exposed through the drain contact hole 243.

Figure 7B:
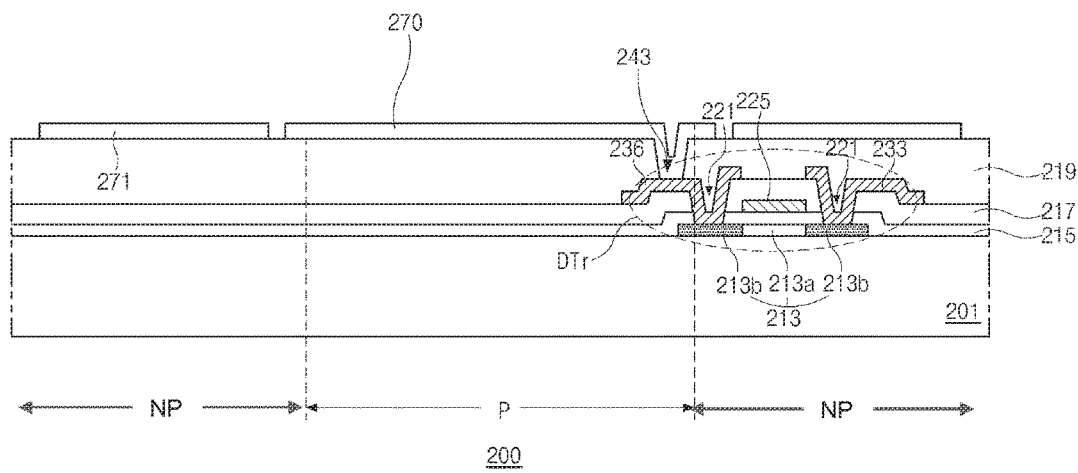

Next, as shown in FIG. 7B, the first electrode 270 and the auxiliary electrode 271 are formed on the passivation layer 219. The first electrode 270 and the auxiliary electrode 271 may be simultaneously formed together. The first electrode 270 is formed in the pixel region P, and the auxiliary electrode 271 is formed in the non-pixel region NP. The first electrode 270 is electrically connected to the drain electrode 136 through the drain contact hole 243. For example, each of the first electrode 170 and the auxiliary electrode 271 may be formed of a transparent conductive material, e.g., ITO or IZO.

Figure 7C:
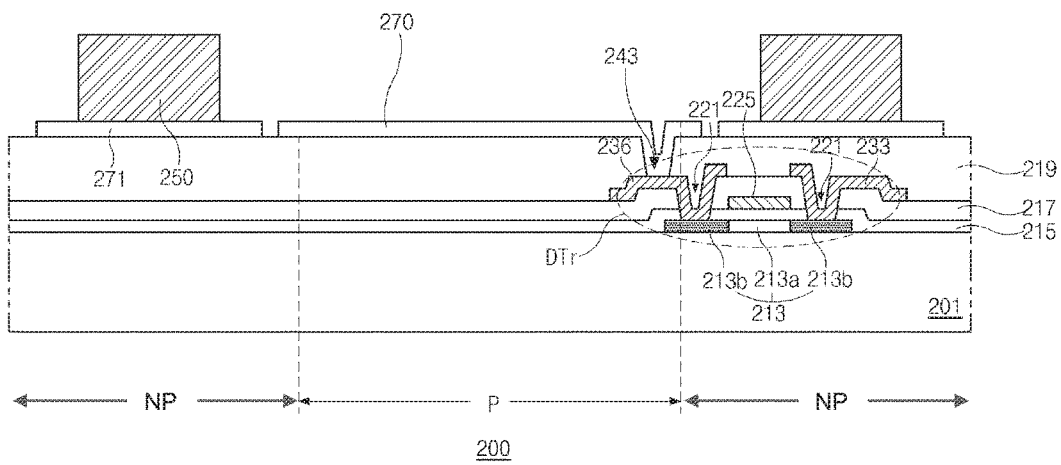

Next, as shown in FIG. 7C, the auxiliary line 250 is formed on the auxiliary electrode 271. The auxiliary line 250 may have a width smaller than a width of the auxiliary electrode 271 to expose the opposite edges of the auxiliary electrode 271.

The auxiliary line 250 includes a low resistance metallic material. For example, the auxiliary line 250 may include at least one of Cu, Mo and Al and may have single or multi-layered structure.

Figure 7D:
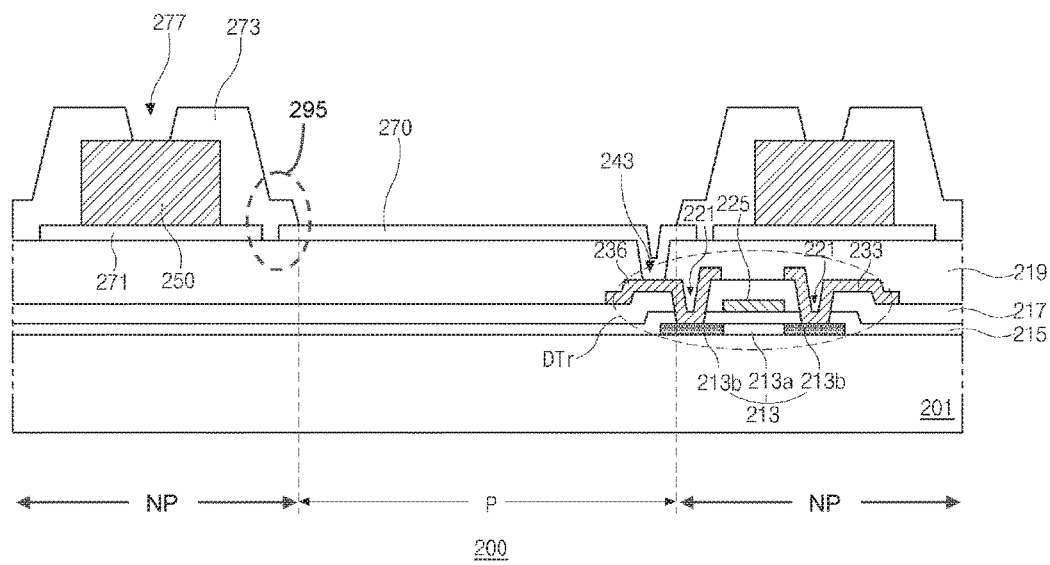

Next, as shown in FIG. 7D, the bank 273 covering the auxiliary line 250 and an edge of the first electrode 270 is formed. The bank 273 may cover the opposite edges of the auxiliary electrode 271 protruding from the auxiliary line 250. The bank 273 may have a stair shape 295 side surface. Namely, a lower part of the bank 273 protrudes toward the pixel region P.

A mask process is performed to form the auxiliary contact hole 277 exposing the auxiliary line 250. The bank 273 may include an organic material or an inorganic material. When the organic emitting layer 275 may be formed by a soluble process, the bank 273 may have a hydrophobic property.

Figure 7E:
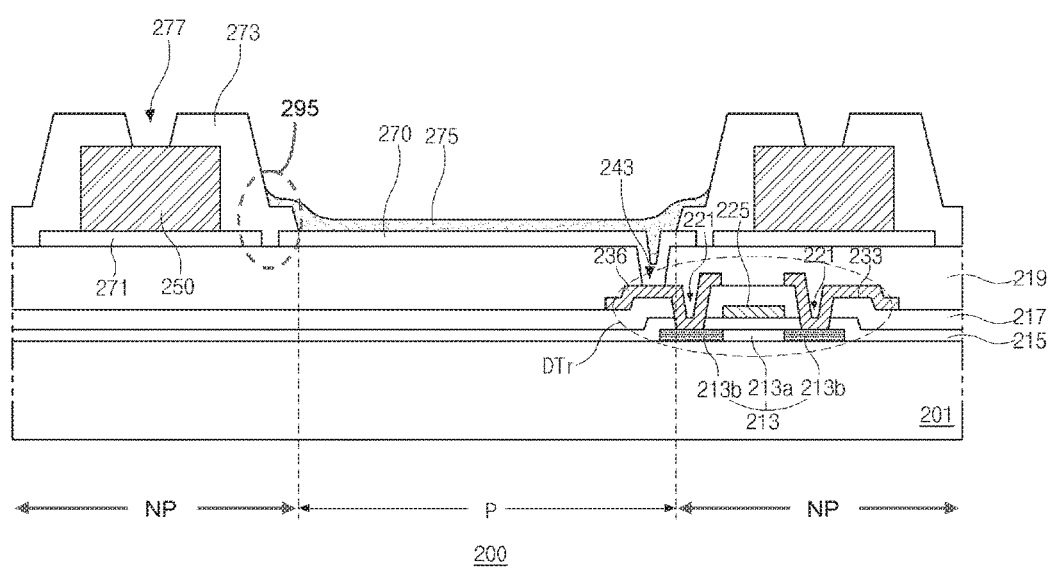

Next, as shown in FIG. 7E, the organic emitting layer 275 is formed on the first electrode 270 in the pixel region P. The organic emitting layer 275 may include a red emitting pattern, a green emitting pattern, a blue emitting pattern, and a white emitting pattern or some other color light emitting pattern. The organic emitting layer 275 may be formed by a deposition process or a soluble process, e.g., an inkjet printing and a nozzle printing.

Since the bank 273 has the stair shape 295 due to the auxiliary electrode 271 and the auxiliary line 250, a pile-up problem generated during a drying process of the organic emitting layer 275, which is formed by a soluble process, is decreased. As a result, the thickness uniformity of the organic emitting layer 275 is improved.

Figure 7F:
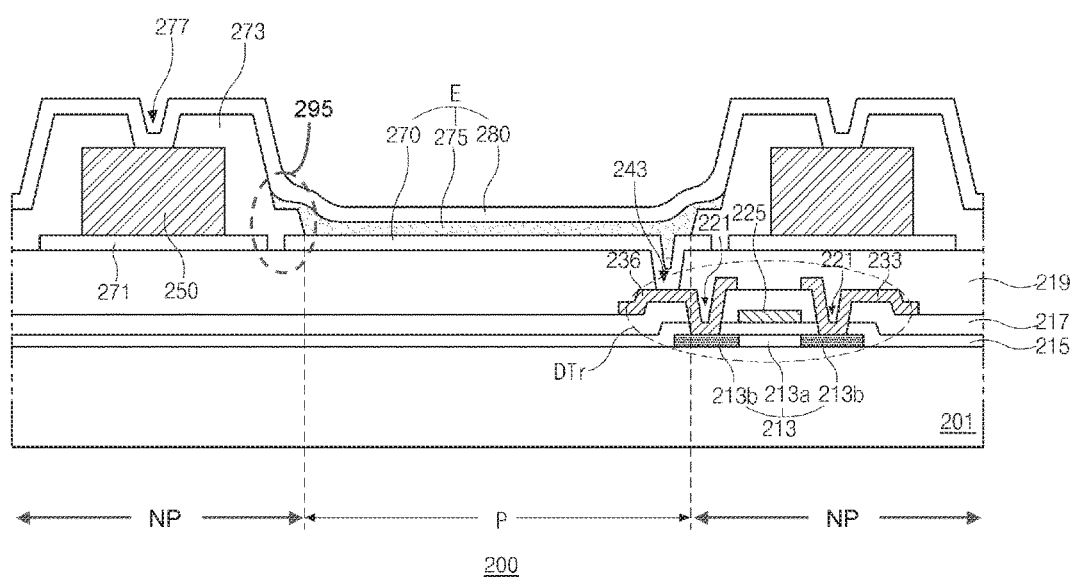

Next, as shown in FIG. 7F, the second electrode 280 is formed over an entire surface of the substrate 201. As a result, the second electrode 280 is formed on the bank 273 and the organic emitting layer 275, and is electrically connected to the auxiliary line 250 through the auxiliary contact hole 277.

The second electrode 280 may include a metallic material having a relatively low work function to serve as a cathode. For example, the metallic material for the second electrode 280 may be silver, magnesium or their alloy.

In the OLED device 200 of the present invention, the voltage drop problem can be prevented without the second passivation layer 41 (of FIG. 1) and the first auxiliary contact hole 53 (of FIG. 1).

In addition, since the auxiliary line 250 having a relatively large thickness is positioned inside the bank 273, a total thickness of the OLED device 200 is not increased by the auxiliary line 250.

As a result, the fabricating process of the OLED device 200 is simplified, and the production cost of the OLED device 200 is reduced.

Moreover, since the auxiliary electrode 271, which is disposed under the auxiliary line 250 and contacts a lower surface of the auxiliary line 250, is formed in a process for the first electrode 270, the voltage drop problem in the second electrode 280 is further prevented without an additional process.

Furthermore, since the bank 273 has a side surface of a stair shape 295, the thickness uniformity of the organic emitting layer 275, which is formed by a soluble process, is improved.

Accordingly, the OLED device 200 having uniform brightness, thin profile and high display quality is provided without an additional process or thickness increase.

Figure 8:
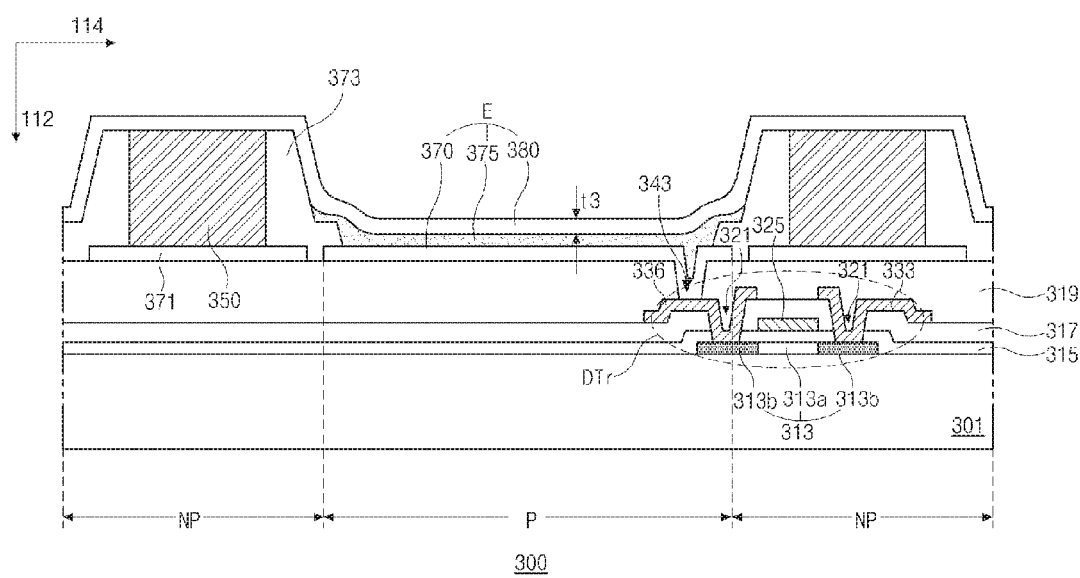
FIG. 8 is a schematic plane view of an OLED device according to a third embodiment of the present invention.

FIG. 8 is a schematic cross-sectional view of an OLED device according to a third embodiment of the present invention.

Referring to FIG. 8, the OLED device 300 includes the substrate 301 having the pixel region P and the non-pixel region NP, the driving TFT DTr, the first and second electrodes 370 and 380, an organic emitting layer 375 (also referred to as "an organic light emitting layer 375") between the first and second electrodes 370 and 380, the bank 373 in the non-pixel region NP, the auxiliary electrode 371, which is spaced apart from the first electrode 370, and the auxiliary line 350 on the auxiliary electrode 371.

In this instance, the first and second electrodes 370 and 380 and the organic emitting layer 375 therebetween constitute the organic emitting diode E.

The first electrode 370 is positioned in the pixel region P and includes a conductive material having a relatively high work function to serve as an anode. For example, the first electrode 370 may include a transparent conductive material, e.g., indium-tin-oxide (ITO) and indium-zinc-oxide (IZO).

The auxiliary electrode 371 is disposed in the non-pixel region NP. The auxiliary electrode 371 is formed of the same material and disposed on the same layer as the first electrode 370.

The auxiliary line 350 is formed of a different material than a material of the first electrode 370 and has a resistance smaller than a resistance of the second electrode 380. For example, the auxiliary line 350 may include a low resistance metallic material, e.g., copper (Cu), molybdenum (Mo) and aluminum (Al), and may have single or multi-layered structure.

In FIG. 8, the auxiliary line 350 has a width in a horizontal direction 114 smaller than a width of the auxiliary electrode 371 in the horizontal direction 114 such that opposite edges of the auxiliary electrode 371 are exposed. Alternatively, the auxiliary line 350 may have the same width as the auxiliary electrode 371.

The bank 373 covers side surfaces of the auxiliary line 350, the edges of the auxiliary electrode 371 and an edge of the first electrode 370. The bank 373 has the same height as the auxiliary line 350 from the substrate 301 or the passivation layer 319 in a vertical direction 112 such that an entire top surface of the auxiliary line 350 is exposed. Namely, a thickness of the bank 373 is equal to a thickness summation of the auxiliary electrode 371 and the auxiliary line 350. As a result, the bank 373 and the auxiliary line 350 may form a flat top surface.

When the auxiliary line 350 has the width smaller than a width of the auxiliary electrode 371 to expose the edges of the auxiliary electrode 371, a side surface of the bank 373 has a stair shape 395. Namely, the bank 373 has a protruding portion at a lower part to form the stair shape.

In this instance, a bent portion of the stair shape 395 is positioned between the auxiliary electrode 371 and the first electrode 370. When the bent portion of the stair shape 395 is positioned on the auxiliary electrode 371, an amount of an organic material on the protruding portion of the bank 373 is increased. On the other hand, when the bent portion of the stair shape 395 is positioned on the first electrode 370, the protruding portion becomes too short such that a pile-up problem, i.e., a coffee ring effect problem, is insufficiently prevented. Extending the stair shape 295 towards a center of the first electrode 270 may prevent the pile-up problem, but overextending the stair shape 295 towards the first electrode 270 decreases an emitting area.

The bank 373 may include an organic material or an inorganic material. When the organic emitting layer 375 is formed by a soluble process, the bank 373 may have a hydrophobic property.

The organic emitting layer 375 is disposed on a center of the first electrode 370 exposed through an opening of the bank 373. The organic emitting layer 375 may include a red emitting pattern, a green emitting pattern, a blue emitting pattern, and a white emitting pattern. The organic emitting layer 375 may be formed by a deposition process or a soluble process, e.g., an inkjet printing and a nozzle printing.

Since the bank 373 has the stair shape 295 due to the auxiliary electrode 371 and the auxiliary line 350 and the bank 373 includes a hydrophobic property material, a pile-up problem generated during a drying process of the organic emitting layer 375, which is formed by a soluble process, is decreased. As a result, the thickness uniformity of the organic emitting layer 375 is improved.

The second electrode 380 is disposed on the bank 373, the auxiliary line 350 and the organic emitting layer 375. The second electrode 380 may include a metallic material having a relatively low work function to serve as a cathode. For example, the metallic material for the second electrode 380 may be silver, magnesium or their alloy.

The second electrode 380 is electrically connected to the auxiliary line 350. The second electrode 380 contacts an entire top surface of the auxiliary line 350 such that a contact area between the second electrode 380 and the auxiliary line 350 is increased. As a result, a contact resistance between the second electrode 380 and the auxiliary line 350 is reduced.

Namely, the sheet resistance of the second electrode 380 is further lowered due to the increase of the contact area between the second electrode 380 and the auxiliary line 350. Accordingly, the voltage drop problem in the second electrode 380 and the non-uniform brightness problem in the OLED device 300 may be prevented.

The driving TFT DTr, which is positioned between the substrate 301 and the first electrode 370 and is connected to the first electrode 370, is formed on the substrate 301.

The driving TFT DTr includes the semiconductor layer 313, the gate electrode 325, the source electrode 333 and the drain electrode 336.

For example, the semiconductor layer 313 including a first region 313a and second regions 313b at both sides of the first region 313a is formed on a substrate 301. The first region 313a is formed of intrinsic poly-silicon, and the second region 313b is formed of impurity-doped poly-silicon.

The gate insulating layer 315 is formed on the semiconductor layer 313, and the gate electrode 325 corresponding to the first region 313a of the semiconductor layer 313 is formed on the gate insulating layer 315. The interlayer insulating layer 317 is formed on the gate electrode 325.

In this instance, the semiconductor contact holes 321 are formed through the gate insulating layer 315 and the interlayer insulating layer 317 to expose the second regions 313b of the semiconductor layer 313.

The source electrode 333 and the drain electrode 336, which are spaced apart from each other, are formed on the interlayer insulating layer 317. The source and drain electrodes 333 and 336 are electrically connected to the second regions 313b of the semiconductor layer 313 through the semiconductor contact holes 321, respectively.

The passivation layer 319, which may include a flat top surface, is formed on or over the driving TFT DTr. In this instance, the drain contact hole 343, which exposes the drain electrode 336 of the driving TFT DTr, is formed through the passivation layer 319.

The first electrode 370 is disposed on the passivation layer 319 and in the pixel region P. The first electrode 370 is electrically connected to the drain electrode 336 through the drain contact hole 343.

In addition, the auxiliary electrode 371 is disposed on the passivation layer 319 and in the non-pixel region NP to be spaced apart from the first electrode 370. In other embodiments, the first electrode 370 is electrically connected to the source electrode 333, instead of the drain electrode 336.

The auxiliary line 350 is disposed on the auxiliary electrode 371 and is also spaced part from the first electrode 370.

It will be apparent to those skilled in the art that various modifications and variations can be made in the embodiments of the invention without departing from the spirit or scope of the invention. Thus, it is intended that the embodiments of the invention cover the modifications and variations of this invention provided they come within the scope of the appended claims and their equivalents.

What is claimed is:

1. An organic light emitting display device, comprising:
    a substrate including a pixel region and a non-pixel region;
    a first electrode over the substrate in the pixel region;
    an organic emitting layer over the first electrode in the pixel region;
    a bank over the substrate in the non-pixel region;
    an auxiliary conductive line covered by the bank in the non-pixel region, a thickness of the auxiliary conductive line greater than a thickness of the first electrode; and
    a second electrode on the organic emitting layer in the pixel region and on the bank in the non-pixel region, the second electrode electrically connected to the auxiliary conductive line,
    wherein the auxiliary conductive line comprises first material and the second electrode comprises second material, the first material having lower resistance than the second material,
    wherein the bank covers side surfaces of the auxiliary conductive line and a first portion of an upper surface of the auxiliary conductive line and includes an auxiliary contact hole exposing a second portion of the upper surface of the auxiliary conductive line, and
    wherein the second electrode contacts the second portion of the auxiliary conductive line through the auxiliary contact hole.

2. The organic light emitting display device according to claim 1, wherein the bank surrounds the organic emitting layer to define the pixel region.

3. The organic light emitting display device according to claim 1, wherein the bank includes a hydrophobic property material.

4. The organic light emitting display device according to claim 1, further comprising:
    an auxiliary electrode in the non-pixel region, the auxiliary electrode in a same layer as the first electrode but separated from the first electrode by the bank, the auxiliary electrode electrically coupled to the auxiliary conductive line.

5. The organic light emitting display device according to claim 1, further comprising:
    a thin film transistor over the substrate; and
    a passivation layer over the thin film transistor,
    wherein the auxiliary conductive line and the first electrode are both formed above the passivation layer.

6. The organic light emitting display device according to claim 1, wherein a side surface of the bank has a stair shape where the side surface of the bank adjoins the first electrode between the pixel region and the non-pixel region.

7. The organic light emitting display device according to claim 1, wherein the auxiliary conductive line has the thickness greater than a sum of thicknesses of the first electrode, the organic emitting layer and the second electrode.

8. The organic light emitting display device according to claim 1, wherein the auxiliary conductive line has a sheet resistance smaller than a sheet resistance of the second electrode.

9. The organic light emitting display device according to claim 1, wherein the second electrode has a thickness such that a light transmittance of the second electrode is 10% or more or a thickness such that a sheet resistance of the second electrode is 100 Ω/sq or less.

10. A method of manufacturing an organic light emitting display device, the method comprising:
    forming a substrate including a pixel region and a non-pixel region;
    forming a first electrode over the substrate in the pixel region;
    forming an auxiliary conductive line over the substrate in the non-pixel region, a thickness of the auxiliary conductive line greater than a thickness of the first electrode;
    forming a bank to cover side surfaces of the auxiliary conductive line and a first portion of an upper surface of the auxiliary conductive line and to include an auxiliary contact hole exposing a second portion of the upper surface of the auxiliary conductive line;
    forming an organic emitting layer over the first electrode in the pixel region through an opening of the bank in the pixel region; and
    forming a second electrode on the organic emitting layer in the pixel region and on the bank in the non-pixel region, the second electrode in contact with the second portion of the auxiliary conductive line and connected to the auxiliary conductive line through the auxiliary contact hole, wherein the auxiliary conductive line comprises first material and the second electrode comprises second material, the first material having lower resistance than the second material.

11. The method of claim 10, wherein the organic emitting layer is formed by a soluble process.

12. The method of claim 10, further comprising:
    forming an auxiliary electrode in the non-pixel region, the auxiliary electrode in a same layer as the first electrode, the auxiliary electrode in the non-pixel region and the first electrode simultaneously formed together, wherein the auxiliary conductive line is electrically coupled to the auxiliary electrode.

13. The method of claim 12, wherein the bank including a hydrophobic property material is formed by a soluble process to fill a space between the auxiliary electrode and the first electrode to separate the auxiliary electrode and the first electrode.

14. The method of claim 13, wherein a side surface of the bank has a stair shape where the side surface of the bank adjoins the first electrode between the pixel region and the non-pixel region.

15. The method of claim 10, further comprising:
forming a thin film transistor over the substrate prior to forming the first electrode and the auxiliary conductive line; and
forming a passivation layer over the thin film transistor prior to forming the first electrode and the auxiliary conductive line,
wherein the auxiliary conductive line and the first electrode are both formed above the passivation layer.

16. An organic light emitting display device, comprising:
a substrate having a pixel region and a non-pixel region;
a first electrode on the substrate;
an auxiliary electrode on the substrate, the auxiliary electrode spaced apart from the first electrode;
an auxiliary line on the auxiliary electrode;
a bank in the non-pixel region, the bank including a hydrophobic property material;
a second electrode on the substrate, the second electrode electrically connected to the auxiliary line;
an organic emitting layer between the first and second electrodes;
wherein a side surface of the bank has a stair shape where the side surface of the bank adjoins the first electrode between the pixel region and the non-pixel region, a protruding portion of the bank at a lower part of the bank forming the stair shape extending towards a center of the first electrode, and a bent portion of the stair shape is positioned between the auxiliary electrode and the first electrode, thereby preventing a pile-up problem generated during a drying process of the organic emitting layer by a soluble process and improving a thickness uniformity of the organic emitting layer.

17. The organic light emitting display device according to claim 16, wherein the auxiliary line has a width smaller than a width of the auxiliary electrode to expose both edges of the auxiliary electrode.

18. The organic light emitting display device according to claim 16, wherein a thickness of the bank is equal to a thickness summation of the auxiliary electrode and the auxiliary line, and the bank and the auxiliary line form a flat top surface.

19. The organic light emitting display device according to claim 16, wherein the auxiliary line has a same width as the auxiliary electrode.

20. The organic light emitting display device according to claim 16, wherein the auxiliary line and the auxiliary electrode are positioned inside the bank and a sufficient space for increasing a thickness of the auxiliary line is provided such that a voltage drop in the second electrode can be reduced.

21. The organic light emitting display device according to claim 16, wherein the auxiliary line has a thickness greater than a sum of thicknesses of the first electrode, the organic emitting layer and the second electrode.

* * * * *